United States Patent [19]

Kuno

[11] Patent Number: 5,365,093
[45] Date of Patent: Nov. 15, 1994

[54] SOLID-STATE IMAGING DEVICE WITH TAPERED CHANNEL REGIONS

[75] Inventor: Yoshinori Kuno, Kanagawa, Japan

[73] Assignee: Sony Corporation, Tokyo, Japan

[21] Appl. No.: 39,566

[22] Filed: Mar. 19, 1993

[30] Foreign Application Priority Data

Mar. 30, 1992 [JP] Japan ................... 4-074583

[51] Int. Cl.⁵ ............... H01L 29/78; H01L 27/14; H01L 31/00
[52] U.S. Cl. ................... 257/233; 257/229; 257/231; 257/234; 257/240; 257/243; 257/249
[58] Field of Search ............... 257/229, 231, 232, 233, 257/234, 240, 243, 249

[56] References Cited

U.S. PATENT DOCUMENTS 4,398,301 8/1983 Dyck ................... 257/240
5,182,622 1/1993 Iizuka et al. ........... 257/249

Primary Examiner—Ngan Van Ngo
Attorney, Agent, or Firm—Hill, Steadman & Simpson

[57] ABSTRACT

A solid-state imaging device. An intermediate portion of a channel region have a tapered width from one shift register in which the signal charges to be read-out toward the other shift register. Therefore, the potential distribution of the channel region along the charge transfer direction has a continuous down-slope toward the one shift register. Thus, reading-out electric field can be improved.

12 Claims, 4 Drawing Sheets

5,365,093

SOLID-STATE IMAGING DEVICE WITH TAPERED CHANNEL REGIONS

FIELD OF THE INVENTION

The present invention relates to a solid-state imaging device. In particular, it relates to a linear sensor which is constructed so that signal charges accumulated in photosensitive regions formed of, for example, p-n junction photodiodes are transferred through read-out gates to shift registers of charge coupled device (CCD).

BACKGROUND OF THE INVENTION

As shown in FIG. 3, the CCD linear sensor has channel regions 12 separated by channel stopper regions 11 which are formed by P-type impurity diffusion. Read-out gate electrodes 13 (13a, 13b) and shift registers 14 (14a, 14b) are formed common to the respective channel regions 12. Particularly, part of each of the channel region 12 is covered by a light-shielding film 15 so that a photosensitive region 16 is formed within each of the channel region 12.

In the charge accumulation period, signal charges e corresponding to image information are accumulated in each of the photosensitive regions 16. In the next reading-out period, the signal charges e accumulated in, for example, odd-numbered photosensitive regions 16 are transferred through one read-out gate 13a to one shift register 14a. The signal charges e accumulated in the even-numbered photosensitive regions 16 are transferred through the other read-out gate 13b to the other shift register 14b. The signal charges e transferred to the shift registers 14a and 14b are further transferred in the horizontal direction, i.e. to an output circuit (not shown) by a two-phase transfer pulse.

When the signal charges are transferred from the photosensitive regions 16 through the read-out gates 13 to the shift registers 14, the transfer efficiency for each photosensitive region 16 must be substantially equal. Therefore, in the conventional CCD linear sensor, the channel regions 12 are formed uniformly square, for example, rectangular in their surfaces as illustrated.

FIG. 4 shows the potential diagram taken along a line II—II in FIG. 3. It will be seen that the potential distribution in the channel region is substantially flat since the surface shape of the channel region 12 is rectangular. Therefore, when the reading-out operation is performed at a higher frequency, part of the signal charges remains at the fore end (or at a in FIG. 4) of the photosensitive region 16. That is, so-called transfer residue occurs thereat.

Moreover, at a portion in the channel region where reading-out electric field is minimum, or at the intermediate portion (as represented by b in FIG. 4), the potential distribution is flat. Besides, the flat portion b is long. Therefore, in the intermediate portion b, the signal charges e are transferred at a slow speed. As a result, a frequency (sampling frequency) of a pulse to be applied for read-out driving is limited.

For this reason, upon read-out driving, the conventional CCD linear sensor cannot increase the transferring speed of the signal charges e even by applying a read-out pulse of a high sampling frequency. Consequently, the speed-up of reading-out operation cannot be realized.

As shown in FIG. 5, a CCD linear sensor is proposed in which the width D of all the channel regions 12 is continuously widened over the whole of each channel region 12 toward the shift registers 14.

FIG. 6 shows the potential diagram taken along a line III—III in FIG. 5. It will be seen that a potential gradient locally occurs at the fore end a of the photosensitive region 16 and at a portion (c in FIG. 6) of the channel region 12 corresponds to the read-out gate 13a. However, the intermediate portion b of the channel region 12 still has a substantially flat potential distribution.

Therefore, even in the CCD linear sensor shown in FIG. 5 and 6, the transfer operation for the signal charges e is limited in the intermediate portion b of the channel region 12. Thus, even if a read-out pulse of a high sampling frequency is applied, the transfer speed for the signal charges e will not be increased. In addition, since the fore end a of the photosensitive region 16 coincides with that of the channel region 12, a sharp gradient of the potential distribution occurs at the fore end a of the photosensitive region 16. Thus, part of the signal charges e are not accumulated at the fore end a of the photosensitive region 16. It causes reduction of the opto-electro conversion efficiency at the photosensitive region 16.

SUMMARY OF THE INVENTION

In view of the circumstances mentioned, it is an object of the present invention to provide a solid-state imaging device which is capable of improving the reading-out electric field within the channel regions and increasing the speed of the reading-out operation.

It is another object of the present invention to provide a solid-state imaging device which is capable of improving an opto-electro conversion efficiency in the photosensitive region.

In one aspect of the present invention, a solid-state imaging device includes channel regions which are separated by channel stopper regions. The channel region includes a first portion, a second portion and a third portion. The first portion is adjacent to a first end and has a first width. The second portion has a second width smaller than the first width. The third portion is connected therebetween and has a tapered width extending from the first width to the second width. The solid-state imaging device further includes photosensitive regions which are formed within each channel region, a read-out gate which is formed on the first end of the channel region and a shift register which is adjacent to the read-out gate.

In another aspect of the present invention, a solid-state imaging device includes channel regions which are separated by channel stopper regions. The channel region includes a first portion, a second portion and a third portion. The first portion is adjacent to a first end and has a tapered configuration at a first rate toward the first end. The second portion has a tapered configuration at a second rate toward the first portion. The third portion is connected therebetween and has a tapered configuration at a third rate. The third rate is larger than the first rate and the second rate. The solid-state imaging device further includes photosensitive regions which are formed within each channel region, a read-out gate which is formed on the first end of the channel region and a shift register which is adjacent to the read-out gate.

In accordance with the present invention, the intermediate portion of the channel regions have a tapered width from one shift register in which the signal charges to be read-out toward the other shift register.

Therefore, the potential distribution of the channel region along the charge transfer direction has a continuous down-slope toward the one shift register. Thus, reading-out electric field can be improved. Consequently, even if the reading operation is made at a high sampling frequency, no charge remains at a fore end of the photosensitive portion. Besides, signal charges can be transferred at a high speed corresponding to the sampling frequency.

BRIEF DESCRIPTION OF THE DRAWINGS

The invention will be more readily understood with reference to the accompanying drawing, wherein.

DETAILED DESCRIPTION OF THE PREFERRED EMBODIMENTS

The preferred embodiment of the present invention will be described in detail by referring to FIGS. 1 and 2.

Figure 1:
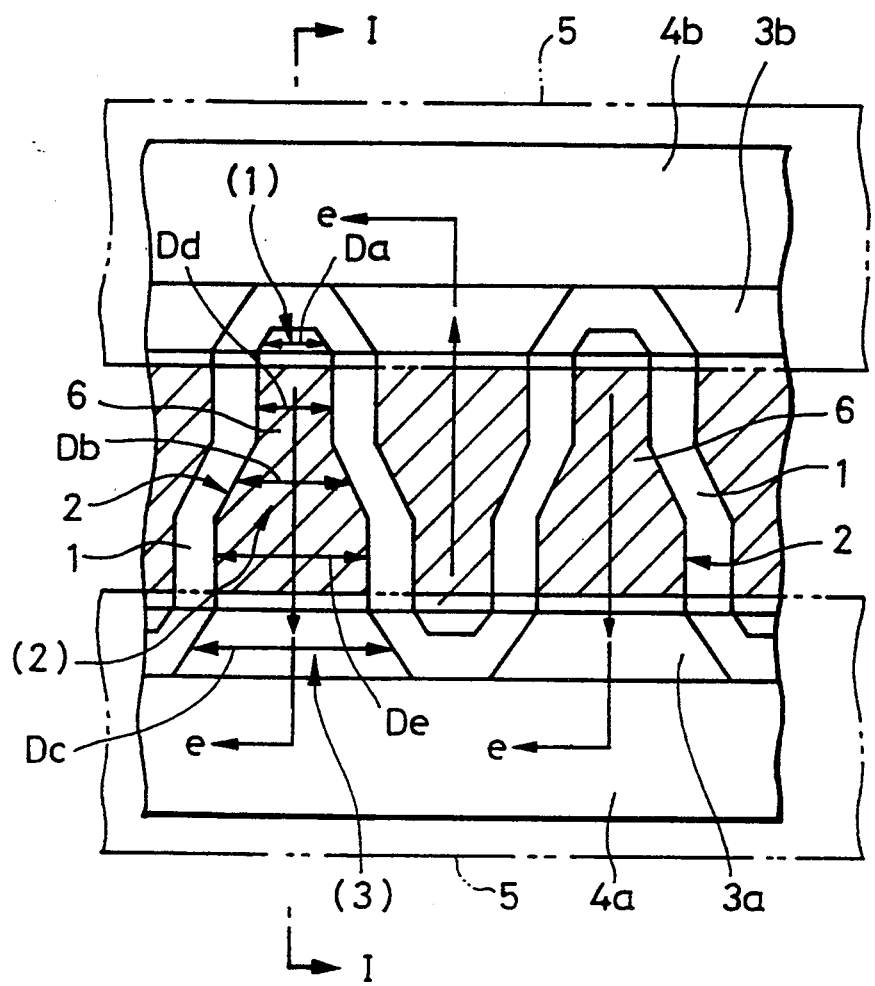
FIG. 1 is a plan view of a embodiment representing the solid-state imaging device of the present invention.
Figure 2:
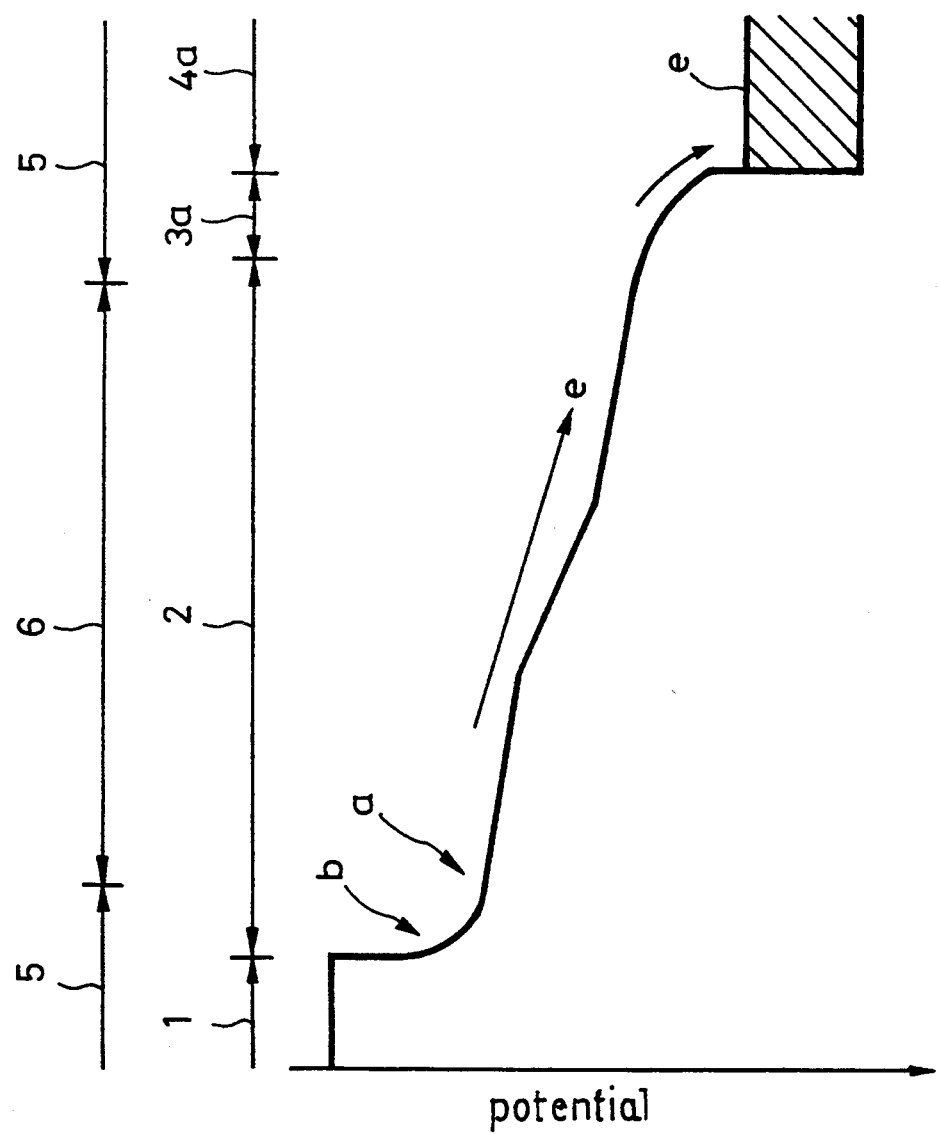
FIG. 2 is a potential diagram taken along a line I—I in FIG. 1.
Figure 3:
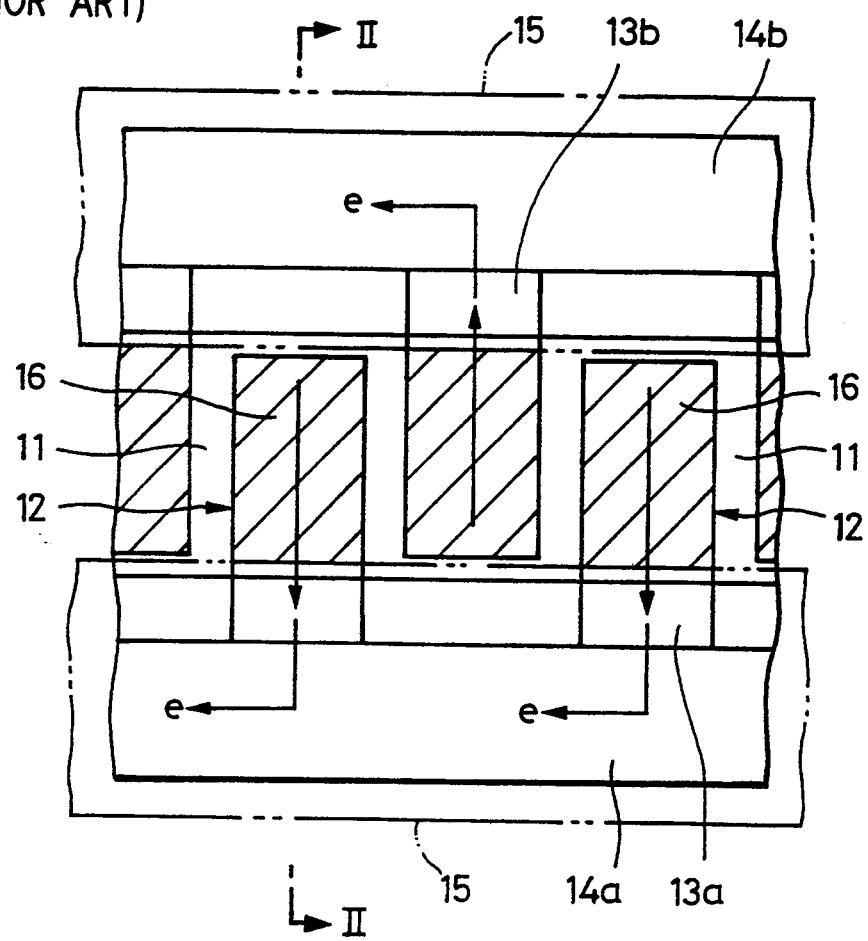
FIG. 3 is a plan view of a conventional solid-state imaging device.
Figure 4:
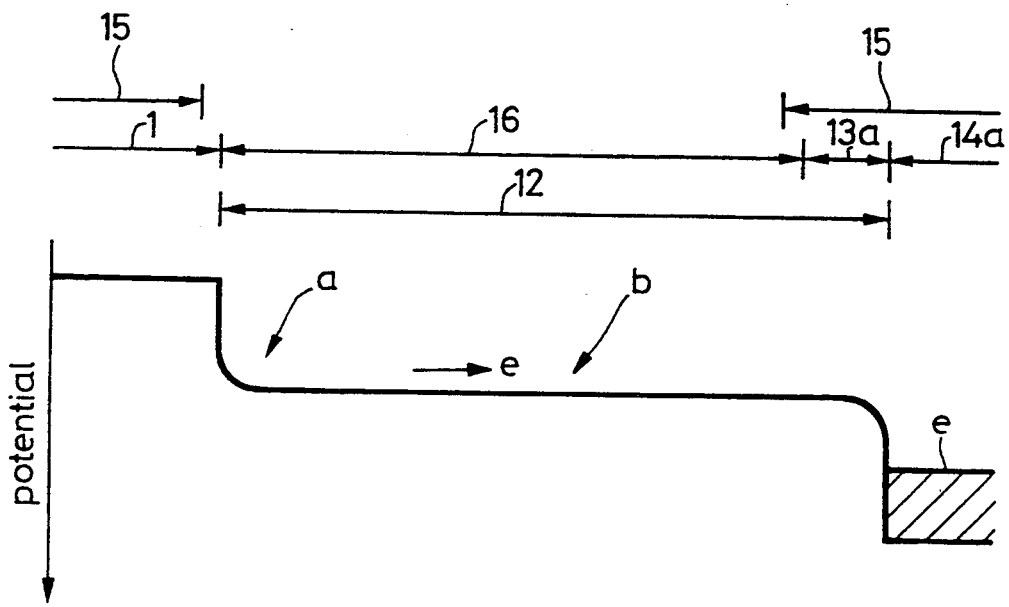
FIG. 4 is a potential diagram taken along a line II—II in FIG. 3.
Figure 5:
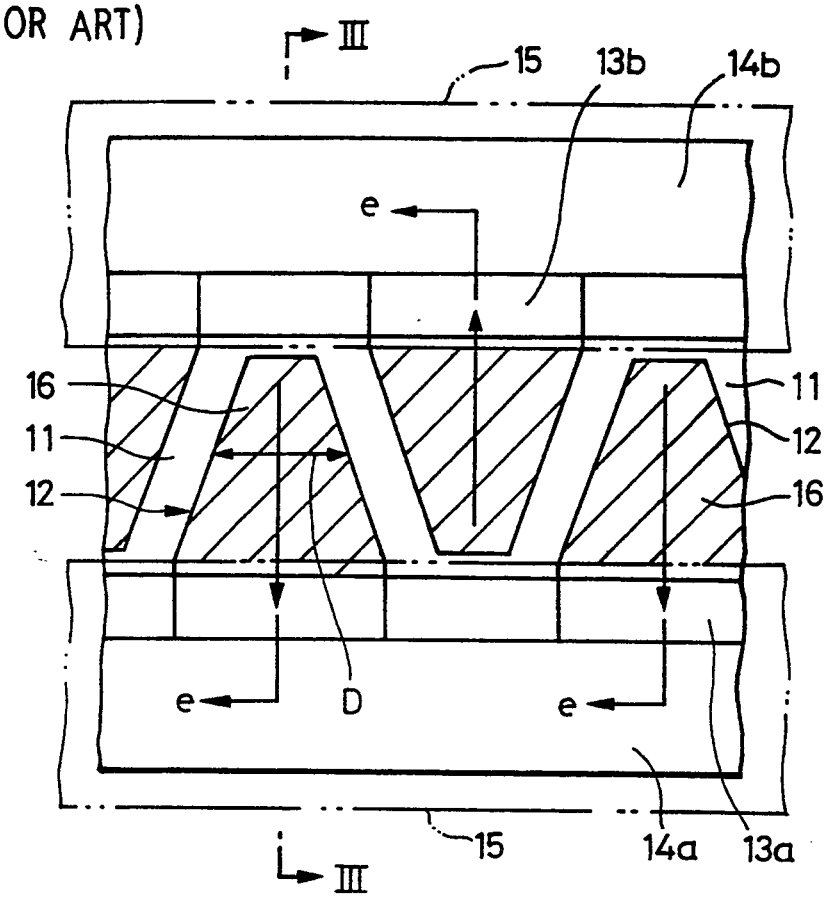
FIG. 5 is a plan view of another conventional solid-state imaging device.
Figure 6:
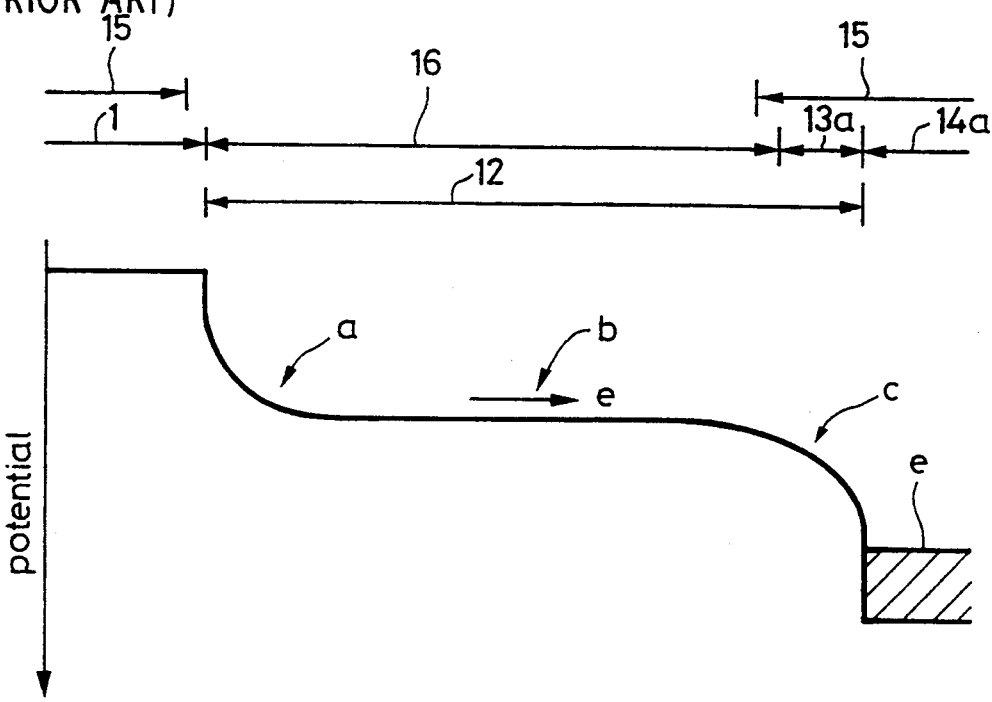
FIG. 6 is a potential diagram taken along a line III—III in FIG. 5.

As shown in FIG. 1, the CCD linear sensor in this embodiment has channel regions 2 separated for the respective pixels by channel stopper regions 1 which are formed by P-type impurity diffusion. Read-out gate electrodes 3 (3a, 3b) and shift registers 4 (4a, 4b) are formed common to the respective channel regions 2.

The part of the channel regions 2 corresponding to the read-out gates 3 and the shift registers 4 are covered by a light-shielding film 5, for example, Aluminum. Therefore, photosensitive regions 6 (the shaded areas in FIG. 1) are formed within the channel regions 2. As illustrated, the read-out gates 3 (3a, 3b) and the shift registers 4 (4a, 4b) are provided on both sides of the photosensitive regions 6 to be common to the respective photosensitive regions 6.

In the charge accumulation period, the signal charges e corresponding to image information is accumulated in each of the photosensitive regions 6. In the next reading-out period, the charges e accumulated in odd-numbered photosensitive regions 6 are transferred through the one read-out gate 3a to the one shift register 4a. The signal charges e accumulated in even-numbered photosensitive regions 6 are transferred through the other read-out gate 3b to the other shift register 4b. The signal charges e transferred to the shift registers 4a and 4b are further transferred in the horizontal direction, i.e. to an output circuit (not shown) by a two-phase transfer pulse.

In this embodiment, each of the channel regions 2 are formed in the following pattern.

(1) The intermediate portion (indicated at (2) in FIG. 1) of the channel region 2 have a tapered width Db from one shift register 4a in which the signal charges e to be read-out toward the other shift register 4b. The portion (2) corresponds to the portion in which the reading-out electric field is the minimum, when the shape of the channel region 2 is rectangular as in the conventional solid-state imaging device.

By the pattern formation (1), it is possible to improve the reading-out electric field. Because the potential distribution of the channel region 2 along the charge transfer direction along line I—I in FIG. 1 has a continuous down-slope toward the shift register 4a as shown in FIG. 2. Therefore, even if the reading-out operation is performed at a high sampling frequency, no charges remain upon transfer at the fore end (indicated by a in FIG. 2) of the photosensitive region 6. That is, the signal charges e can be transferred at a high speed corresponding to the sampling frequency.

(2) The length of the channel region 2 is increased in the charge transfer direction to be a value longer than the photosensitive region 6. The projection corresponding to the value, or the fore end (indicated at (1) in FIG. 1) of the channel region 2 includes a tapered configuration (width Da) extending away from one shift register 4a in which the signal charges e to be read-out toward the other shift register 4b.

By the pattern formation (2), it is possible that the potential distribution at the fore end a of the photosensitive region 6 has a continuous down-slope toward the shift register 4a. As a result, the signal charges e accumulated at the fore end a of the photosensitive region 6 can be transferred at a high efficiency to the shift register 4a. Moreover, since an extreme slope is not formed at the fore end a of the photosensitive region 6, the signal charges e can be accumulated at the fore end a as well. Thus the opto-electro conversion efficiency in the photosensitive region 6 can be improved.

(3) The part of the channel region 2 corresponding to the read-out gate 3a (as indicated at (3) in FIG. 1) is wider in its width Dc toward the shift register 4a in which the signal charges e to be read-out.

By the pattern formation (3), it is possible that the signal charges e transferred from the photosensitive region 6 are transferred at a high efficiency to the shift register 4a because the reading-out electric field increases in the channel region 2 under the read-out gate 3a.

(4) The other parts of the channel region 2 than the fore end (1) of the channel region 2, the intermediate portion (2) of the channel region 2 and the part corresponding to the read-out gate (3) of the channel region 2 are made constant in their widths Dd and De, respectively.

The item (4) in the pattern formation is not always necessary. For example, the widths Dd and De may be continuously increased toward the shift register 4 in which the signal charges e to be read-out. In such case, it is required that the rate of change of the widths Dd and De are smaller than that of the width Db.

The above embodiment is the CCD linear sensor in which the photosensitive regions 6 are arranged in one direction. However, this invention may be applied to other imaging devices, for example, a CCD area sensor in which a photosensitive regions are arranged in the horizontal and vertical directions, or in a matrix.

While specific embodiments of the invention have been shown and disclosed, it is to be understood that numerous changes and modifications may be made by those skilled in the art without departing from the scope and intent of the invention.

What is claimed is:

1. A solid-state imaging device comprising:

channel regions having a first end, said channel regions separated by channel stopper regions and having a first portion adjacent to said first end, said first portion having a first width, a second portion having a second width smaller than said first width and a third portion connected therebetween having a tapered width extending from said first width to said second width, photosensitive regions formed within each said channel region, a read-out gate formed on said first end of each said channel region, and a shift register adjacent to said read-out gate.

2. A solid-state imaging device according to claim 1, wherein said third portion locates an intermediate portion of said channel region.

3. A solid-state imaging device according to claim 1, wherein a reading-out electric field is minimum in said third portion.

4. A solid-state imaging device according to claim 1, said channel region having a fourth portion connected to said second portion, wherein said fourth portion includes a tapered configuration extending away from said second portion.

5. A solid-state imaging device according to claim 1, said channel region having a fifth portion connected to said first portion and located beneath said read-out gate, wherein said fifth portion is wider toward said shift register than at said first portion.

6. A solid-state imaging device comprising:

channel regions having a first end, said channel regions separated by channel stopper regions and having a first portion adjacent to said first end, said first portion having a tapered configuration at a first rate toward said first end, a second portion having a tapered configuration at a second rate toward said first portion and a third portion connected therebetween having a tapered configuration at a third rate, photosensitive regions formed within each said channel region, a read-out gate formed on said first end of said channel region, and a shift register adjacent to said read-out gate, wherein said third rate is larger than said first rate and said second rate.

7. A solid-state imaging device according to claim 6, wherein said third portion locates intermediate portion of said channel region.

8. A solid-state imaging device according to claim 7, wherein a reading-out electric field is minimum in said third portion.

9. A solid-state imaging device according to claim 7, said channel region having a fourth portion connected to said second portion, wherein said fourth portion includes a tapered configuration extending away from said second portion.

10. A solid-state imaging device according to claim 7, said channel region having a fifth portion connected to said first portion and located beneath said read-out gate, wherein said fifth portion is wider toward said shift register than at said first portion.

11. A solid-state imaging device comprising:

channel regions having a first end, said channel regions separated by channel stopper regions and having a first portion adjacent to said first end, said first portion having a first width, a second portion having a second width smaller than said first width, a third portion connected therebetween having a tapered width extending from said first width to said second width and located at an intermediate portion of said channel region, a fourth portion connected to said second portion and including a tapered configuration extending away from said second portion and a fifth portion connected to said first portion and including a tapered configuration extending toward said first portion, photosensitive regions for accumulating signal charges, formed within each said channel region, a read-out gate for read out of said signal charges, formed on said first end of said channel region, a shift register for transferring said signal charge, adjacent to said read-out gate, and a light-shielding film formed on said read-out gate and said shift register.

12. A solid-state imaging device comprising:

channel regions having a first end, said channel regions separated by channel stopper regions and having a first portion adjacent to said first end, said first portion having a tapered configuration at a first rate toward said first end, a second portion having a tapered configuration at a second rate toward said first portion, a third portion connected therebetween having a tapered configuration at a third rate, a fourth portion connected to said second portion and including a tapered configuration extending away from said second portion and a fifth portion connected to said first portion and including a tapered configuration extending toward said first portion, photosensitive regions for accumulating signal charges, formed within each said channel region, a read-out gate for read out said signal charges, formed on said first end of said channel region, a shift register for transferring said signal charge, adjacent to said read-out gate, and a light-shielding film formed on said read-out gate and said shift register, wherein said third rate is larger than said first rate and said second rate.

* * * * *